United States Patent
Choi et al.

(10) Patent No.: US 10,423,331 B2
(45) Date of Patent: Sep. 24, 2019

(54) POLYMORPHIC STORAGE DEVICES

(71) Applicant: SAMSUNG ELECTRONICS CO., LTD., Suwon-si, Gyeonggi-do (KR)

(72) Inventors: Inseok Stephen Choi, Redwood City, CA (US); Yang Seok Ki, Palo Alto, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 290 days.

(21) Appl. No.: 15/133,085

(22) Filed: Apr. 19, 2016

(65) Prior Publication Data
US 2017/0220259 A1    Aug. 3, 2017

Related U.S. Application Data

(60) Provisional application No. 62/290,295, filed on Feb. 2, 2016.

(51) Int. Cl.
| | | |
|---|---|---|
| *G06F 12/00* | (2006.01) | |
| *G06F 3/06* | (2006.01) | |
| *G11C 7/10* | (2006.01) | |

(52) U.S. Cl.
CPC .............. *G06F 3/0605* (2013.01); *G06F 3/06* (2013.01); *G06F 3/0634* (2013.01); *G06F 3/0685* (2013.01); *G11C 7/1072* (2013.01)

(58) Field of Classification Search
None
See application file for complete search history.

(56) References Cited

U.S. PATENT DOCUMENTS

| | | | |
|---|---|---|---|
| 7,676,665 B2 | 3/2010 | Wyatt | |
| 7,747,837 B2 | 6/2010 | Gorobets et al. | |
| 8,583,938 B2 | 11/2013 | Chan et al. | |
| 8,812,976 B2 | 8/2014 | Kollin et al. | |
| 2009/0094597 A1 | 4/2009 | Moskalik et al. | |
| 2011/0161952 A1* | 6/2011 | Poddar | G06F 9/455 717/173 |
| 2013/0227563 A1† | 8/2013 | McGrath | |
| 2014/0047342 A1† | 2/2014 | Breternitz et al. | |
| 2017/0053190 A1* | 2/2017 | Cheatham, III | G06K 9/00362 |
| 2017/0109041 A1* | 4/2017 | Qiu | G06F 3/0619 |

OTHER PUBLICATIONS

Alexandre Solomatnikov, "Polymorphic Chip Multiprocessor Architecture," A Dissertation Submitted to the Department of Electrical Engineering and the Committee on Graduate Studies of Stanford University in Partial Fulfillment of the Requirements for the Degree of Doctor of Philosophy, Dec. 2008, 167 pages, ProQuest LLC, Ann Arbor, MI.

\* cited by examiner
† cited by third party

*Primary Examiner* — Baboucarr Faal
(74) *Attorney, Agent, or Firm* — Innovation Counsel LLP

(57) ABSTRACT

A storage device includes an application container containing one or more applications; a polymorphic storage device (PSD) kernel configured to receive a plurality of packets including data, messages, and commands from a host computer, and route the plurality of packets to an application in the application container based on a command included in the plurality of packets; and a PSD interface layer configured to provide an interface between the one or more applications and the PSD kernel. The storage device can be transformed from a first type of storage device to a second type of storage device according to the control command received via the PSD control interface.

20 Claims, 6 Drawing Sheets

POLYMORPHIC STORAGE DEVICES

CROSS-REFERENCE TO RELATED APPLICATION(S)

This application claims the benefits of and priority to U.S. Provisional Patent Application Ser. No. 62/290,295 filed Feb. 2, 2016, the disclosure of which is incorporated herein by reference in its entirety.

TECHNICAL FIELD

The present disclosure relates generally to storage devices and, more particularly, to a polymorphic storage device that can transform into different devices via a device control interface.

BACKGROUND

Compared to conventional data storage devices such as hard disk drives, solid-state drives (SSDs) provide more complexity and pseudo-general programmability. For example, flash memory-based SSDs increasingly package more powerful CPUs and a higher-capacity memory and storage and make those resources available to a user application. Moreover, for data intensive applications, it is considered that moving codes to data is far more efficient than moving data to codes. Thus, efficient data processing systems try to push codes as far down into a query-processing pipeline as possible by using techniques such as early selection pushdown and early aggregation (or pre-aggregation). Similarly, parallel or distributed data processing systems can run as much of the queries close to a node that holds the data.

Traditionally, code-offloading techniques have been implemented by tweaking an operating system (OS) of a host computer and a firmware of an SSD in an ad-hoc manner. Although the boundaries among persistent storage, volatile storage, and processing are increasingly getting blurrier, the existing functional separation among the host OS, libraries, fixed protocols, and a storage device abstraction layer commonly introduces redundant implementations and can become a bottleneck or a wasteful resource-consumer.

Non SQL (NoSQL) databases (DBs) (e.g., key-value stores, document stores, graph, object databases, etc.) are widely used in modern computer systems. Compared to relational DBs, NoSQL DBs are simple, flexible and lightweight and can provide excellent scalability and large performance gains with certain workloads. The rapid move to cloud computing and large systems with big data contributes to the growing popularity of NoSQL DBs.

FIG. 1 shows a traditional NoSQL database (DB) system. The NoSQL DB system 100 includes overlapped components and redundant mappings. The NoSQL DB system 100 includes a host computer 110 and a storage device 150 communicating over a host-to-SSD interface 190. The host computer 110 includes a NoSQL DB 120 that has a mapping table for key to LBA translation 121, an operating system 130, and an SSD interface 140. The examples of the host-to-SSD interface 190 include, but are not limited to, Peripheral Component Interconnect Express (PCIe), Serial Attached SCSI (SAS), Ethernet, and Serial AT Attachment (SATA). The storage device 150 includes a memory controller 160 and a non-volatile memory 170. The memory controller 160 includes a host interface 161, a LBA-PBA mapping table 162, an error-correcting code (ECC) memory 163, and a flash interface 164 for interfacing with the non-volatile memory 170. The host computer 110 and the storage device 150 communicate with commands, LBAs, and data over the host-to-SSD interface 190.

There are two redundant mapping layers including a first mapping layer for key-LBA mapping and a second mapping layer for LBA-PBA mapping. Traditionally, the host computer 110 and the storage device 150 communicate with each other based on the LBAs to specify the address of storage locations in the storage device 150. For compatibility, the storage device 150 works with LBAs, and a flash translation layer (FTL) of the memory controller 160 maintains the LBA-PBA translation. The FTL translates logical block addresses (LBAs) into physical block addresses (PBAs) using the mapping table 162, and accesses the physical blocks of the non-volatile memory 170 as indicated by the mapping table 162 to perform the requested operations (e.g., read, write, read/modify/write (RMW), and delete) on the physical blocks of the non-volatile memory 170.

The key-LBA mapping in the host computer 110 can be eliminated if proper arrangements are made between a host computer and a storage device. FIG. 2 shows an example of a system architecture for another traditional NoSQL DB system. The NoSQL DB system 200 can include a host computer 210 and a storage device 250 communicating over a host-to-SSD interface 290. The host computer 210 can include a NoSQL user application program interface (API) 220, an operation system 230, and an SSD interface 240. Similar to the host-to-SSD interface 190 of FIG. 1, the host-to-SSD interface 290 can be any of PCIe, SAS, Ethernet, and SATA, or the like. The storage device 250 can include a memory controller 260 for interfacing with a non-volatile memory 270. The memory controller 260 can include a host interface 261, a NoSQL DB integrated FTL 262, an error-correcting code (ECC) memory 263, and a flash interface 264. The NoSQL DB integrated FTL 262 can eliminate the key-LBA mapping in the host computer 210, therefore the NoSQL DB system 200 can have a better aggregated performance compared to the NoSQL DB system 100 of FIG. 1 that requires two redundant mapping layers.

The host computer 210 and the storage device 250 can communicate with query commands, keys, and data over the host-to-SSD interface 290. The non-volatile memory 270 can be of various types of non-volatile memory including, but not limited to, a flash memory, a phase-change RAM (PRAM), a spin-transfer torque magnetic random access memory (STT-MRAM), and a resistive RAM (ReRAM).

A firmware of the present polymorphic storage device defining behaviors of the storage device can be reconfigured via a firmware update. Through the firmware update, the present polymorphic storage device can be transformed into a different type of devices from the original configuration. For example, the present polymorphic storage is originally configured as a general-purpose storage device. By a firmware update, it can be converted into a special-purpose device, such as an in-storage computing device, a key-value store device, a Hadoop distributed file system (HDFS) device, an object-store device, etc.

FIG. 3 shows layers of a memory controller of an example storage device. The memory controller 360 has four layers, namely, a host interface layer (HIL) 310, a flash translation layer (FTL) 320, a virtual flash layer (VFL) 330, and a flash interface layer (FIL) 340. These four layers can be implemented in the firmware of the storage device that can run on one or more embedded processors of the storage device. The host interface layer 310 can implement a bus interface protocol such as SATA, SAS, or PCI Express (PCIe). The flash translation layer 320 is responsible for mapping logical block addresses (LBAs) in the host OS to physical block addresses (PBAs) in a non-volatile memory of the storage device. The virtual flash layer 330 and the flash interface layer 340 are responsible for data transfer between the non-volatile memory and a DRAM memory of the storage device. The firmware of the storage device can provide other features including an ECC logic and a direct memory access (DMA). To enhance the I/O performance of the non-volatile memory, the memory controller 360 can use interleaving techniques at a chip-level and/or a channel-level.

SUMMARY

According to one embodiment, a storage device includes an application container containing one or more applications; a polymorphic storage device (PSD) kernel configured to receive a plurality of packets including data, messages, and commands from a host computer, and route the plurality of packets to an application in the application container based on a command included in the plurality of packets; and a PSD interface layer configured to provide an interface between the one or more applications and the PSD kernel.

According to another embodiment, a storage system includes: a host computer; a polymorphic storage device (PSD); and a PSD interface for providing an interface between the host computer and the PSD. The PSD includes: an application container containing one or more applications; a PSD kernel configured to receive a plurality of packets including data, messages, and commands from the host computer, and route the plurality of packets to an application in the application container based on a command included in the plurality of packets; and a PSD interface layer configured to provide an interface between the one or more applications and the PSD kernel.

According to yet another embodiment, a method includes storing one or more applications in an application container of a storage device; receiving a plurality of packets including data, messages, and commands from a host computer; routing the plurality of packets to an application in the application container based on a command included in the plurality of packets; running a PSD kernel on the storage device to configure one or more hardware of the storage device according to a control command received from the host computer via a PSD interface; and operating the storage device as configured by the PSD kernel.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles described herein.

Figure 1:
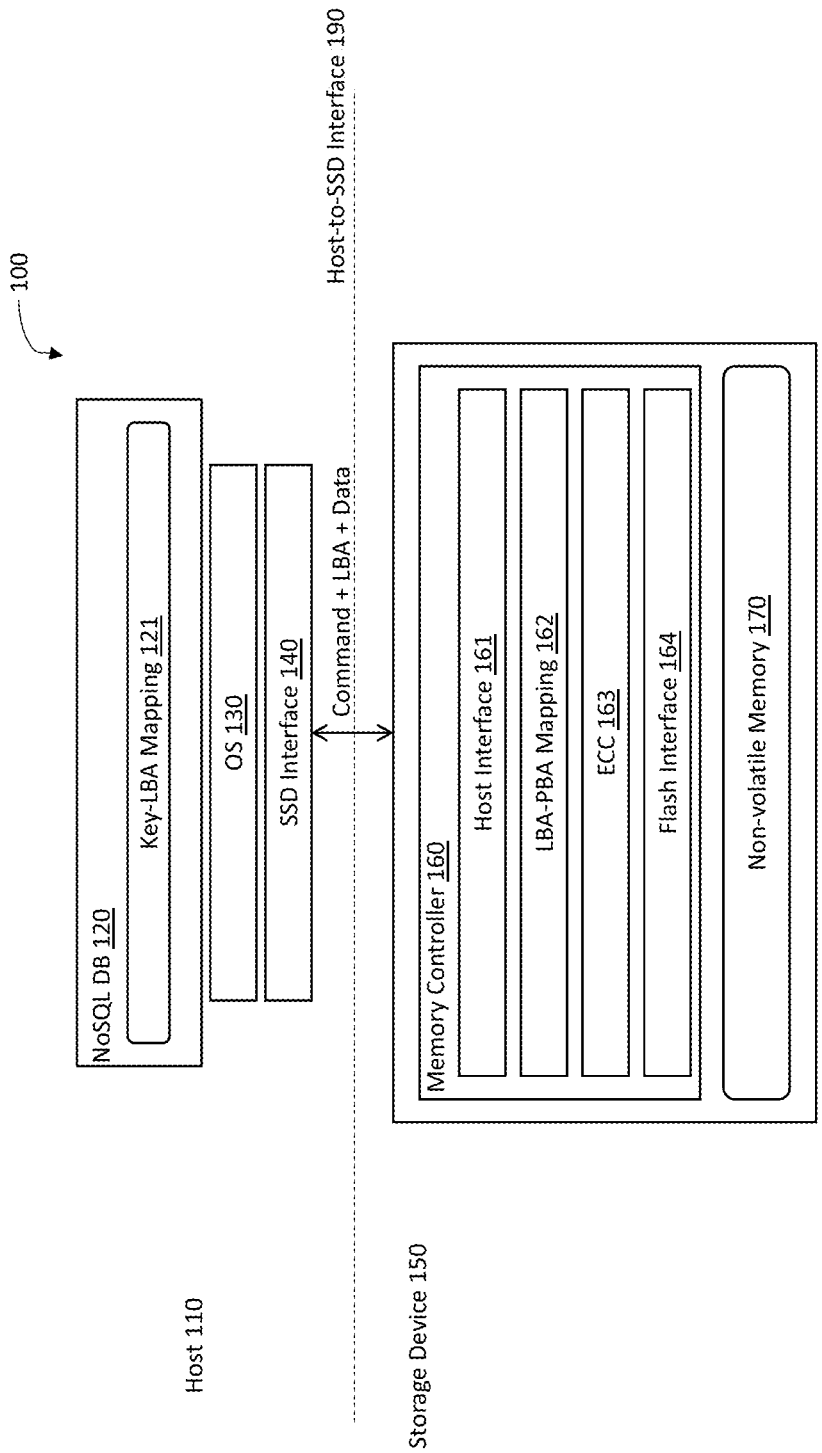
FIG. 1 shows a traditional NoSQL database (DB) system.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Each of the features and teachings disclosed herein can be utilized separately or in conjunction with other features and teachings to provide a polymorphic storage device that can transform into different devices via a device control interface. Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed above in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present disclosure. However, it will be apparent to one skilled in the art that these specific details are not required to practice the teachings of the present disclosure.

Some portions of the detailed descriptions herein are presented in terms of algorithms and symbolic representations of operations on data bits within a computer memory. These algorithmic descriptions and representations are used by those skilled in the data processing arts to effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms presented herein are not inherently related to any particular computer or other apparatus. Various general-purpose systems, computer servers, or personal computers may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the disclosure as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of an original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

Figure 4:
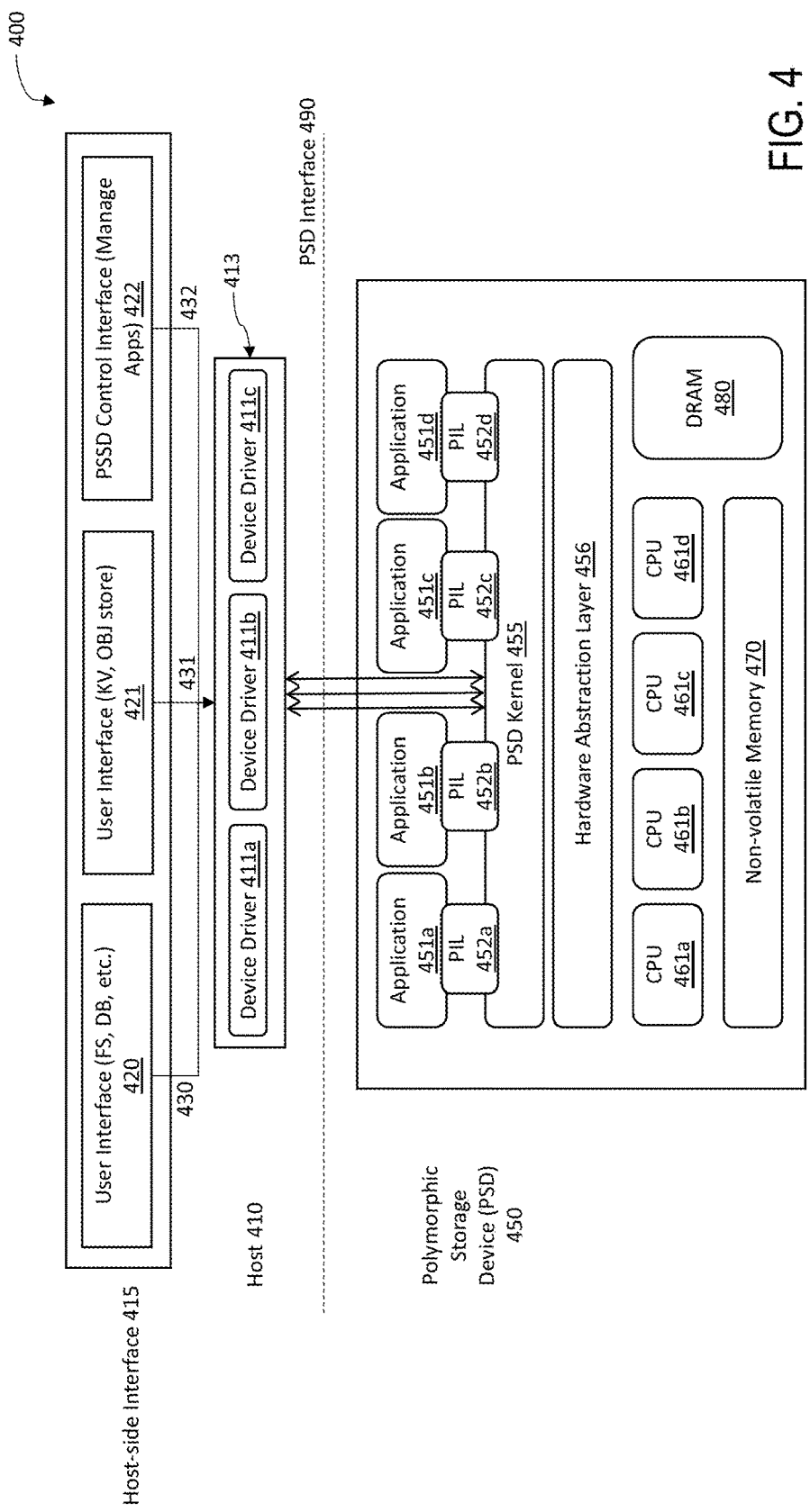
FIG. 4 shows a block diagram of an example storage system including a polymorphic storage device, according to one embodiment.

The present disclosure provides a polymorphic storage device that is transformable from one device type to another device type via a device control interface. FIG. 4 shows a block diagram of an example storage system including a polymorphic storage device, according to one embodiment. The storage system 400 includes a host computer 410 and a polymorphic storage device (PSD) 450 that can communicate via a PSD interface 490. The host computer 410 can include a device driver pool 413 for storing a plurality of device drivers 411a-411c that can be used to reconfigure the PSD 450. The PSD 450 can include a PSD kernel 455, a PSD interface layer (PIL) 452 for interfacing with an application 451, a reconfigurable and extendable hardware including the plurality of CPUs 461a-461d, non-volatile memory 470, and DRAM 480. The PSD 450 can further include a hardware abstraction layer 456 for providing a device driver interface allowing the application 451 to communicate with the reconfigurable and extendable hardware. Although the present example shows that the PSD 450 includes the reconfigurable and extendable hardware, it is understood that the PSD 450 can include non-reconfigurable and non-extendable hardware without deviating from the scope of the present disclosure. The reconfigurable and extendable hardware can provide flexibility and programmability of the PSD 450.

According to one embodiment, a host-side interface 415 can include a first user interface 420, a second user interface 421, and a PSD control interface 422 for the PSD 450. The first user interface 420 may provide, for example, an interface to a file system (FS) and/or a database (DB), or the like. Via the first user interface 420, input/output (I/O) control commands (e.g., device control commands and metadata) required for the file system and the database can be sent to and from the host computer 410. The second user interface 421 may provide, for example, an interface to a key-value and/or an object store, and provides queries 431 (e.g., put, get) for the key-value and/or the object store. The PSD control interface 422 can provide commands and messages 432 to the host computer 410 and to the PSD 450 via the PSD interface 490. Using one of the plurality of device drivers 411a-411c in the device driver pool 413 of the host computer 410, the PSD 450 can be configured (or reconfigured) according to the commands received from the PSD control interface 422. Those commands via the PSD control interface 422 can control the applications 451a-451d running on the PSD 450. Herein, the applications 451a-451d running on the PSD 450 are also referred to as PSD-aware applications because they can configure the PSD using a command received via the PSD control interface 433 and transform the PSD 450 from a first type of storage device to a second type of storage device. The PSD control interface 422 can also provide control the device drivers stored in the host-side device driver pool 413 and their device driver managers.

According to one embodiment, the PSD interface 490 can emulate the host-side user interfaces 420 and 421 for backward compatibility or the PSD control interface 422 for managing and controlling PSD-aware applications 451a-451d running on the PSD 450. Vendor-specific commands can be provided to the PSD-aware applications 451a-451d via the PSD interface 490. Examples of such vendor-specific commands include, but are not limited to, "create", "start/stop", "pause/resume", etc. The PSD 450 can communicate with the host computer 410 and add, remove, and change functionalities or applications without a firmware update.

According to one embodiment, the PSD interface 490 between the host computer 410 and the PSD 450 can provide offloaded or integrated functionalities inside the PSD 450. For example, PSD-aware applications 451 or host-side applications can interact with a user interface of the PSD 450 rather than the storage system interface that is commonly provided by the host OS and the device drivers 411a-411c of the host computer 410. Traditionally, a host-side application running on the host computer 410 implements its functionality on the host computer 410 with an application logic. According to one embodiment, an application logic for a host-side application running on the host computer 410 can be distributed to the PSD 450. For example, an integrated key-value FTL of the PSD 450 can remove virtually all logics at the host side application, and only user APIs for key-value NoSQL operations are provided to the PSD kernel 455 of the PSD 450. The rest of the operations can be handled inside the PSD 450, and a PSD-aware application 451 can run the key-value NoSQL operations using commands and messages that are received via the PSD interface 490.

Since the PSD 450 can handle more than one application (e.g., 451a-451d) at a time, the corresponding host-side device driver 411 may be present in the device driver pool 413. If the PSD 450 has only one active instance of a device driver, the device driver pool 413 is only working with one device driver 411 in a manner that is similar to a traditional storage system. As shown in FIG. 4, the PSD 450 can utilize the PSD control interface 422 that controls instances of applications 451 inside the PSD 450. In this sense, the provisioning of the PSD control interface 422 is similar to a virtual machine (VM) manager or a hypervisor in that the PSD control interface 422 provides a control mechanism of applications 451 rather than directly interacting with the applications 451.

Multiple applications 451 can be running simultaneously on the PSD 450. However, the number of physical communication channels between the host computer 410 and the PSD 450 is limited to the number of physical devices. For this reason, the communication between each application 451 and an application container inside the PSD 450 can be multiplexed and de-multiplexed inside the PSD 450. The PSD interface 490 can be any physical interface including, but not limited to, SATA, SAS, NVMe, Ethernet, Fiber Channel (FC), Infiniband (IB), Remote Direct Memory Access (RDMA), etc. The host-side device driver pool 413 can also take care of multiplexing to embed/encapsulate all messages/commands/data into an existing communication protocol for providing a physical interface. In some embodiments, the PSD's own protocol can be used to reduce an overhead of overloading data onto an existing protocol.

Figure 5:
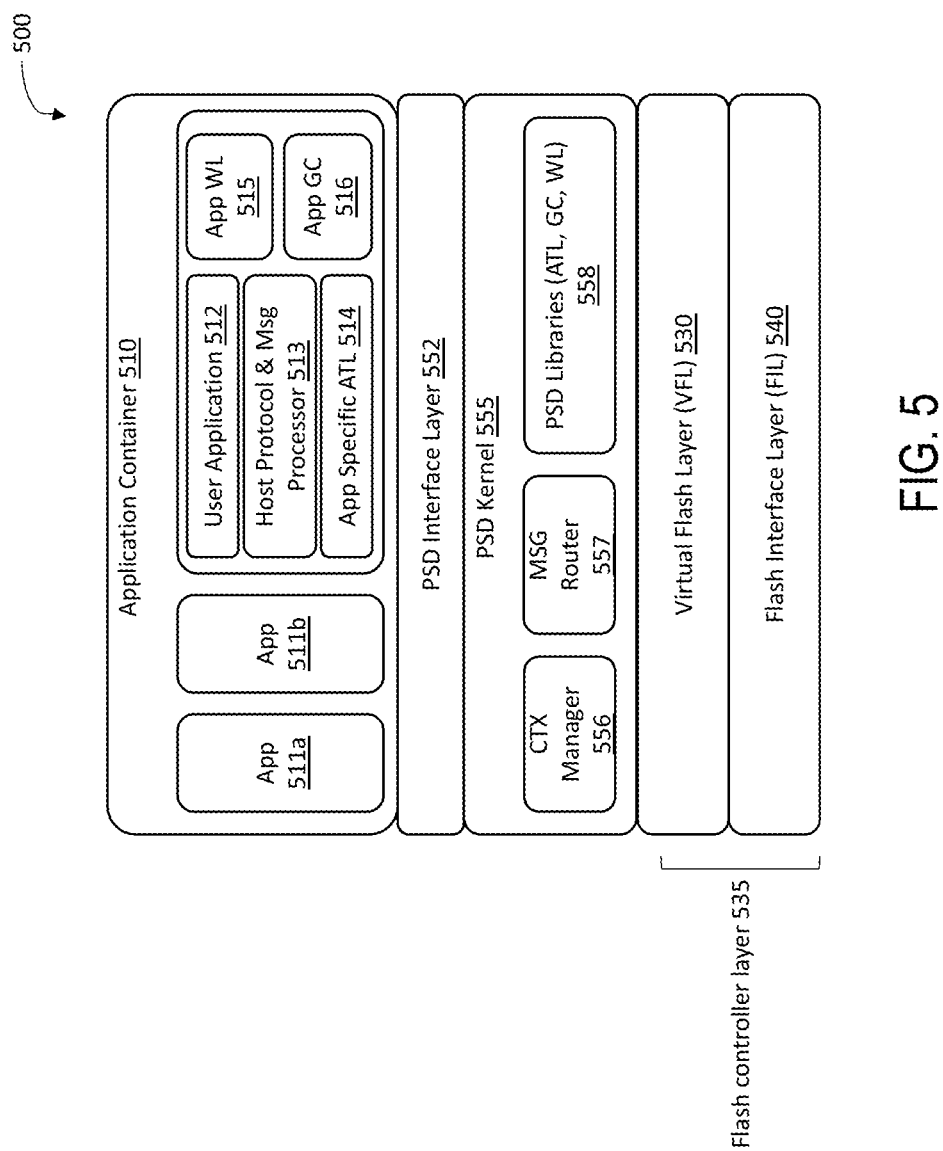
FIG. 5 shows a firmware stack of an example polymorphic storage device, according to one embodiment.

FIG. 5 shows a firmware stack of an example polymorphic storage device, according to one embodiment. The PSD firmware stack 500 includes a flash controller layer 535, a PSD kernel 555, a PSD interface layer 552, and an application container 510. The application container 510 can include one or more applications 511a, 511b, and 511c. In the present example, the application 511c refers to a current tenant that is running on the PSD to differentiate itself from other applications 511a and 511b. Hereinafter, the applications 511a, 511b, and 511c may be collectively referred to as application 511. The application 511 can include a host protocol and message processor 513, an application-specific address translation logic (ATL) 514, an application-specific wear leveling logic 515, and an application-specific garbage collection logic 516.

For example, the application 511 can be one of a key-value caching application, an HDFS application, and a MongoDB application. For the key-value caching application, the ATL 514 can be an index-integrated FTL and the GC 516 can be more efficient by utilizing a least-recently used (LRU) list. For the HDFS application, the ATL 514 can be configured to be smaller from its memory-footprint perspective (e.g., 64 MB for its granularity). Therefore, its application-specific ATL 514 is necessary. Moreover, for some HDFS applications, the GC 516 and the WL 515 can be minimized (or optimized) if they contain mostly, if not all, cold data (i.e., the data that is never updated once created). For the MongoDB application, some of the host operations can be offloaded to the ATL 514 and the GC 516. Each application 511 can have different ATL 514, GC 516, and WL 515 to be suited for the characteristics and requirements of the application 511.

The flash controller layer 535 includes a virtual flash layer (VFL) 530 and a flash interface layer (FIL) 540. The flash controller layer 535 can provide a hardware support to provide increased efficiency for the PSD. Depending on the application 511 running on the PSD, the flash controller layer 535 can optimize the use of the reconfigurable and extendable hardware to provide an efficient interface to the flash memory. The flash controller layer 535 may be updated by a firmware update to support features of the applications 511.

Packets (e.g., data, messages, and commands) received from a host computer are first sent to the PSD kernel 555. The context (CTX) manager 556 and the message router 557 of the PSD kernel 555 are responsible for routing packets received from the host computer. The CTX manager 556 is aware of current tenant application(s) on the PSD along with its characteristics. The CTX manager 556 can include a table of application IDs for tracking both currently running and other existing applications and the configurations of the associated ATL 514, WL 515, and GC 516. The CTX manager 556 is also responsible for controlling the execution and liveness (i.e., context control) of the current tenant application(s) such as start/stop, resume, and suspend, etc. The PSD kernel 555 can de-encapsulate the routed packets and process the routed packets accordingly. For example, if a command to "create" an application 511 is received, the CTX manager 556 can create an application context for the application 511 with the host-provided data. The host-provided data may include configuration profiles or logics for the ATL 514, the WL 515, the GCC 516, as well as a binary code of the application 511 that is executable on the PSD as well as meta-data including a PSD library to allow the application 511 to communicate with the PSD kernel 555.

If a message received from the host computer relates to a registered application 511 on the PSD, the PSD kernel 555 can route the message and the corresponding data and/or commands to the registered application 511 if the context of the registered application 511 is active. If the context of the registered application 511 is not active, the PSD kernel 555 returns an error message to the host computer. The PSD kernel 555 can send other error messages to the host computer if unregistered or unrecognized messages are received from the host computer.

The CTX manager 556 is responsible for controlling the application container 510. The CTX manager 556 can create an application context for applications 511, and distribute and manage the hardware resources of the PSD to the ATL 514, the WL 515, and the GC 516. The CTX manager 556 can be implemented in a fully virtualized manner, similar to a virtual machine (VM), or in a para-virtualized manner. In one embodiment, the application 511 can run as a normal firmware on a generic storage device without implementing the PSD kernel 555. In another embodiment, the application 511 can run as a new application specifically designed for the PSD with awareness of features provided by the PSD.

Some of applications 511 may need application-specific wear leveling (WL) and/or garbage collection (GC) logics. These logics can be critical for the performance of the PSD. The PSD kernel 555 provides PSD libraries 558 including application-specific WL/GC interfaces and generic APIs to interface with the PSD kernel 555. In the latter case, the application 511 can register those libraries provided instead of implementing their own WL/GC logics 515 and 516. In the former case, the PSD kernel 555 does not do anything related to WL/GC by providing full privileges to the application 511 in the layer(s) of the PSD firmware stack 500.

The applications 511 can communicate with the underlying PSD kernel 555 via the PSD interface layer 552. The PSD interface layer 552 can provide communication APIs and packets (e.g., messages, commands, and data) that pass through the PSD interface layer 552 to the PSD.

Figure 2:
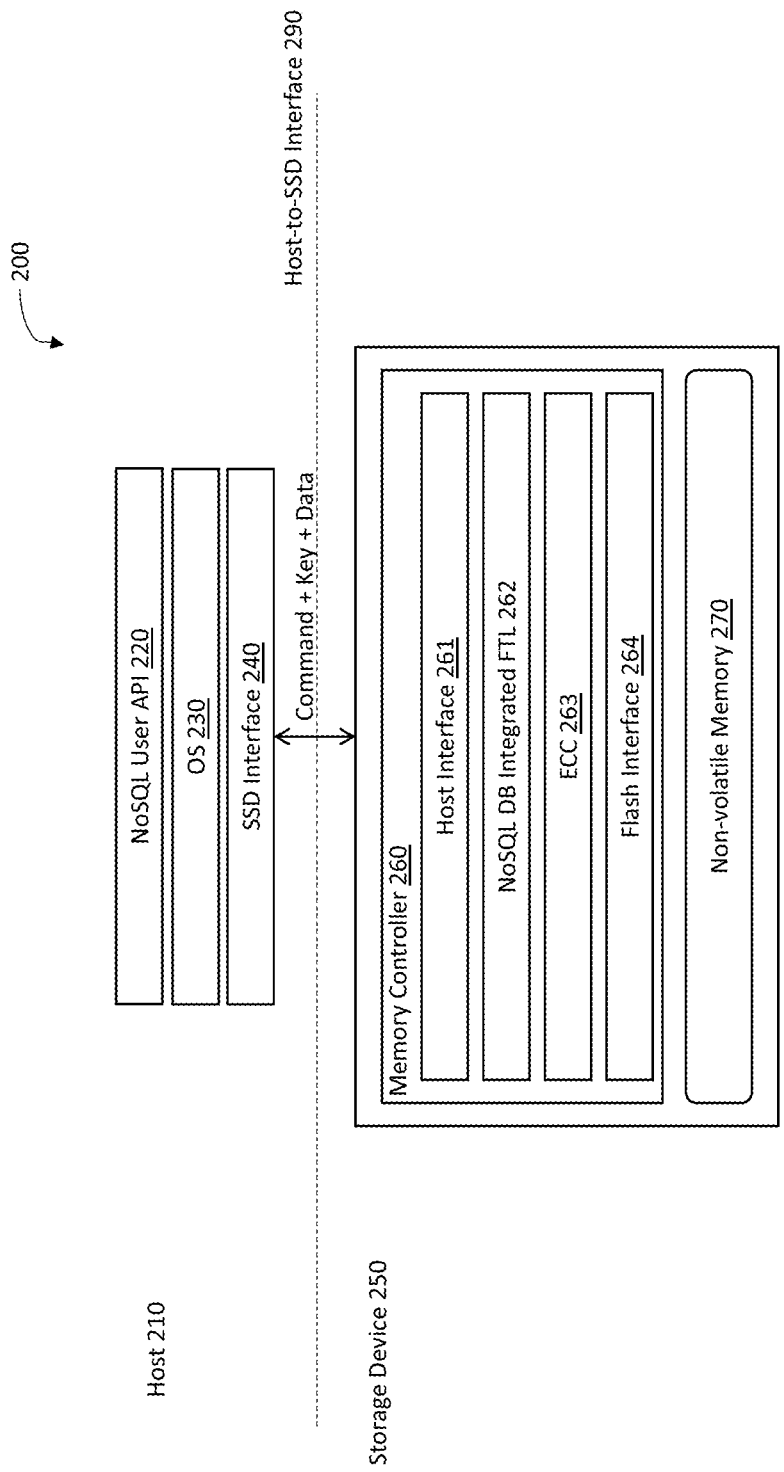
FIG. 2 shows an example of a system architecture for another traditional NoSQL DB system.
Figure 3:
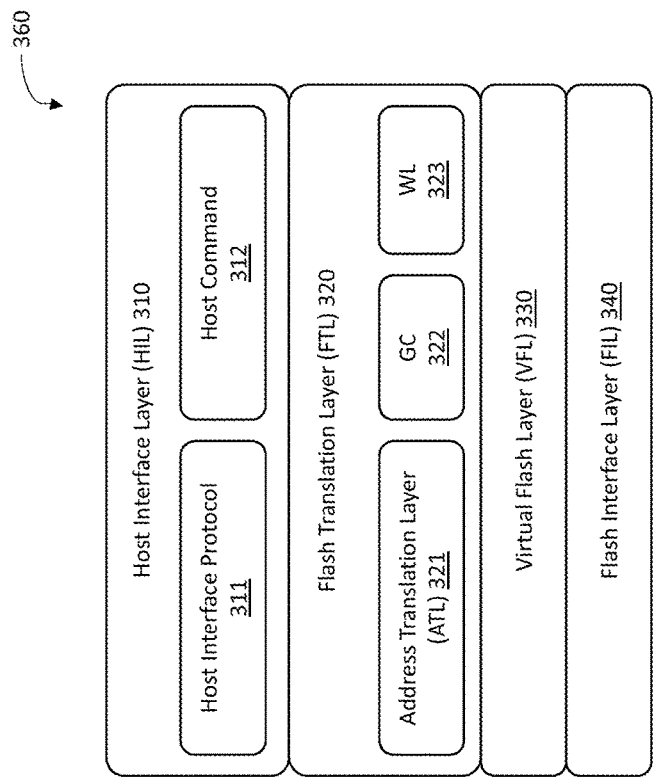
FIG. 3 shows layers of a memory controller of an example storage device.

The application 511 can co-exist on a single PSD in the form of application context(s). The application container 510 can hold application contexts for the applications 511 that may be active or idle. The application 511 can include application logics, a host protocol and message processor layer 513, an application-specific address translation logic (ATL) 514, a wear leveling (WL) logic 515, a garbage collection (GC) logic 516, etc. In some embodiments, the WL and GC logics 514 and 515 are optional. For example, a key-value store application can have their key-value structure and algorithm for the core logics. The host protocol and message processor layer 513 can be as simple as a wrapper of functions of core logics. In the case of key-value store application, the application-specific ATL 514 can be merged into an integrated FTL (e.g., NoSQL DB integrated FTL 262 of FIG. 2).

Although no additional logics are mandatorily required from a hardware perspective on a modern SSD, the following factors can accelerate executions of a PSD. Examples of factors that can accelerate executions of a PSD include, but are not limited to, multiple translation lookaside buffers (TLBs) or a larger TLB, caches with an application container ID, a memory with more banks to reduce conflicts and/or more registers per dual inline memory modules (DIMMs), more flexible support for direct memory access (DMA), and a higher number of outstanding DMAs, a support for virtualization from embedded processors, an application context-aware flash controller, a fine-grain power control with awareness of polymorphism, a hardware-assisted message routing, etc. In another example, the PSD can include a field-programmable gate array (FPGA) to provide an accelerated application-specific functionality. Applications such as a machine-learning kernel, scientific computing in big data processing such as neural network, matrix manipulation, a fast Fourier transform (FFT), pattern matching, etc. can be accelerated with the FPGA rather than running codes on the CPUs of a general-purpose device.

According to one embodiment, the storage system 400 can provide multiple instances (applications) per a single PSD 450 or multiple PSDs. In addition, the storage system 400 can support migration and replication among multiple polymorphic storage devices 450.

Figure 6A:
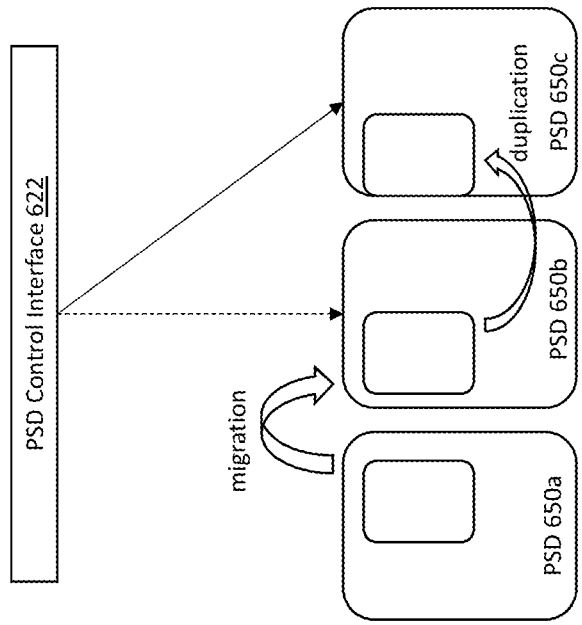
FIG. 6A shows an example of migrating and duplication applications in a centralized manner, according to one embodiment.
Figure 6B:
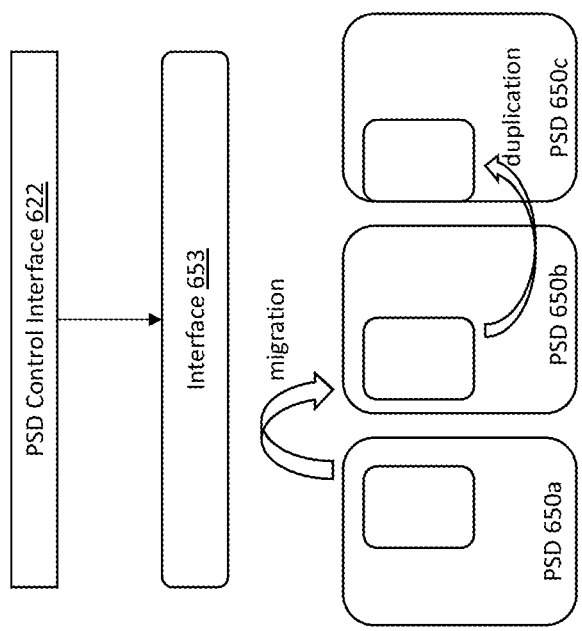
FIG. 6B shows another example of migrating and duplication applications in a decentralized manner, according to one embodiment.

FIGS. 6A and 6B show examples of migrating and duplicating applications among multiple PSDs. Multiple polymorphic storage devices 650a-650c can support application migration and duplication in either a centralized manner or a decentralized manner.

FIG. 6A shows an example of migrating and duplication applications in a centralized manner, according to one embodiment. The PSD control interface 622 can provide commands and messages 432 to perform migration and duplication among the multiple PSDs 650a-650c. In the centralized implementation, the migration and duplication operations can be implemented by the CTX managers (e.g., CTX manager 556 of FIG. 5) of the PSDs 650a-650c and the PSD control interface 653. The PSD control interface 653 can spawn an interface 653 for executing the centralized migration and duplication operations.

FIG. 6B shows another example of migrating and duplication applications in a decentralized manner, according to one embodiment. In the decentralized implementation, each polymorphic device is capable of operating application migration/duplication based on peer-to-peer communication between neighbor devices.

According to one embodiment, a storage device includes an application container containing one or more applications; a polymorphic storage device (PSD) kernel configured to receive a plurality of packets including data, messages, and commands from a host computer, and route the plurality of packets to an application in the application container based on a command included in the plurality of packets; and a PSD interface layer configured to provide an interface between the one or more applications and the PSD kernel.

The storage device may further include one or more hardware that is reconfigurable according to a control command received from the host computer. The reconfigurable hardware may include one or more processors, a non-volatile memory, and a DRAM.

A host-side interface including a PSD control interface and application interfaces may be provided to the host computer.

The storage device may be transformed from a first type of storage device to a second type of storage device according to the control command received via the PSD control interface.

The first type of storage device may be one device of an in-storage computing device, a key-value store device, and a HDFS device, an object-store device, and the second type of storage device may be another device of the in-storage computing device, the key-value store device, and the HDFS device.

The PSD control interface may be configured to provide control commands and messages to the storage device.

The application interfaces may include an emulated hos-side interface configured to provide an emulated host-side interface for backward compatibility and a PSD-aware application interface.

The one or more vendor commands may be provided via the PSD control interface.

The one or more vendor commands may include a create command, a start command, a stop command, a pause command, and a resume command.

The one or more vendor commands may include a migration command or a duplication command for migrating or duplicating an application running on the storage device to another storage device via the PSD control interface.

The application may be migrated or duplicated in a centralized manner or a decentralized manner.

According to another embodiment, a storage system includes: a host computer; a polymorphic storage device (PSD); and a PSD interface for providing an interface between the host computer and the PSD. The PSD includes: an application container containing one or more applications; a PSD kernel configured to receive a plurality of packets including data, messages, and commands from the host computer, and route the plurality of packets to an application in the application container based on a command included in the plurality of packets; and a PSD interface layer configured to provide an interface between the one or more applications and the PSD kernel.

The storage system may further include one or more hardware that is reconfigurable according to a control command received from the host computer. The reconfigurable hardware of the PSD may include one or more processors, a non-volatile memory, and a DRAM.

A host-side interface including a PSD control interface and application interfaces may be provided to the host computer.

The storage device may be transformed from a first type of storage device to a second type of storage device according to the control command received via the PSD control interface.

The PSD control interface may be configured to provide control commands and messages to the PSD.

According to yet another embodiment, a method includes storing one or more applications in an application container of a storage device; receiving a plurality of packets including data, messages, and commands from a host computer; routing the plurality of packets to an application in the application container based on a command included in the plurality of packets; running a PSD kernel on the storage device to configure one or more hardware of the storage device according to a control command received from the host computer via a PSD interface; and operating the storage device as configured by the PSD kernel.

The method may further include reconfiguring the one or more hardware according to another command received from the host computer via the PSD interface. The one or more reconfigurable hardware may include one or more processors, a non-volatile memory, and a DRAM.

The method may further include providing a host-side interface to the host computer. The host-side interface may include a PSD control interface and application interfaces.

The method may further include transforming the PSD from a first type of storage device to a second type of storage device according to the control command received via the PSD control interface.

The above example embodiments have been described hereinabove to illustrate various embodiments of implementing a polymorphic storage device that can transform into different devices via a device control interface. Various modifications and departures from the disclosed example embodiments will occur to those having ordinary skill in the art. The subject matter that is intended to be within the scope of the invention is set forth in the following claims.

What is claimed is:

1. A storage device comprising:
    an application container containing one or more applications;
    a polymorphic storage device (PSD) kernel implemented within the storage device and configured to receive a plurality of packets including data, messages, and commands from a host computer, and route the plurality of packets to an application in the application container based on a command included in the plurality of packets;
    a PSD interface layer configured to provide an interface between the one or more applications and the PSD kernel,
    wherein the PSD kernel is further configured to interface with a plurality of device drivers running on the host computer and transform the storage device between a block data store device and a key-value store device using the plurality of device drivers according to a control command received from the host computer, and
    wherein the block data store device stores a plurality of block data identifiable by block addresses, and the key-value store device stores a plurality of key-value data.

2. The storage device of claim 1, further comprising one or more hardware that is reconfigurable according to the control command received from the host computer, wherein the reconfigurable hardware includes one or more processors, a non-volatile memory, and a dynamic random access memory (DRAM).

3. The storage device of claim 1, wherein a host-side interface comprising a PSD control interface and application interfaces is provided to the host computer.

4. The storage device of claim 3, wherein the control command is received from the host computer via the PSD control interface.

5. The storage device of claim 1, wherein the block data store device is one device of an in-storage computing device, and a Hadoop distributed file system (HDFS) device.

6. The storage device of claim 3, wherein the PSD control interface is configured to provide control commands and messages to the storage device.

7. The storage device of claim 3, wherein the application interfaces comprises an emulated host-side interface configured to provide backward compatibility and a PSD-aware application interface.

8. The storage device of claim 3, wherein one or more vendor commands are provided via the PSD control interface.

9. The storage device of claim 8, wherein the one or more vendor commands include a create command, a start command, a stop command, a pause command, and a resume command.

10. The storage device of claim 8, wherein the one or more vendor commands include a migration command or a duplication command for migrating or duplicating an application running on the storage device to another storage device via the PSD control interface.

11. The storage device of claim 10, wherein the application is migrated or duplicated in a centralized manner or a decentralized manner.

12. A storage system comprising:
    a host computer;
    a polymorphic storage device (PSD); and
    a PSD interface for providing an interface between the host computer and the PSD,
    wherein the PSD comprises:
        an application container containing one or more applications;
        a PSD kernel configured to receive a plurality of packets including data, messages, and commands from the host computer, and route the plurality of packets to an application in the application container based on a command included in the plurality of packets; and
        a PSD interface layer configured to provide an interface between the one or more applications and the PSD kernel,
        wherein the PSD kernel is further configured to interface with a plurality of device drivers running on the host computer and transform the PSD between a block data store device and a key-value store device using the plurality of device drivers according to a control command received from the host computer, and
        wherein the block data store device stores a plurality of block data identifiable by block addresses, and the key-value store device stores a plurality of key-value data.

13. The storage system of claim 12, further comprising one or more hardware that is reconfigurable according to the control command received from the host computer, wherein the reconfigurable hardware of the PSD includes one or more processors, a non-volatile memory, and a DRAM.

14. The storage system of claim 12, wherein a host-side interface comprising a PSD control interface and application interfaces is provided to the host computer.

15. The storage device of claim 14, wherein the control command is received via the PSD control interface.

16. The storage device of claim 14, wherein the PSD control interface is configured to provide control commands and messages to the PSD.

17. A method comprising:
    storing one or more applications in an application container of a storage device;
    receiving a plurality of packets including data, messages, and commands from a host computer; and
    routing the plurality of packets to an application in the application container based on a command included in the plurality of packets;
    running a PSD kernel implemented on the storage device to interface with a plurality of device drivers running on the host computer and transform the storage device between a block data store device and a key-value store device using the plurality of device drivers according to a control command received from the host computer via a PSD interface; and operating the storage device as either the block data store device or the key-value store device as configured by the PSD kernel, wherein the block data store device stores a plurality of block data identifiable by block addresses, and the key-value store device stores a plurality of key-value data.

18. The method of claim 17, further comprising reconfiguring the one or more hardware according to another command received from the host computer via the PSD interface, where the one or more reconfigurable hardware includes one or more processors, a non-volatile memory, and a dynamic random access memory (DRAM).

19. The method of claim 17, further comprising providing a host-side interface to the host computer, wherein the host-side interface comprises a PSD control interface and application interfaces.

20. The method of claim 19, wherein the control command is received via the PSD control interface.

* * * * *